US008447008B2

(12) United States Patent
Yang

(10) Patent No.: US 8,447,008 B2
(45) Date of Patent: May 21, 2013

(54) SHIFT FREQUENCY DEMULTIPLIER WITH AUTOMATIC RESET FUNCTION

(75) Inventor: Xiu Yang, Chengdu (CN)

(73) Assignee: IPGoal Microelectronics (SiChuan) Co., Ltd., Chengdu, Sichuan Province (CN)

( * ) Notice: Subject to any disclaimer, the term of this patent is extended or adjusted under 35 U.S.C. 154(b) by 174 days.

(21) Appl. No.: 13/151,863

(22) Filed: Jun. 2, 2011

(65) Prior Publication Data

US 2011/0299651 A1 Dec. 8, 2011

(30) Foreign Application Priority Data

Jun. 2, 2010 (CN) .......................... 2010 1 0190384

(51) Int. Cl.
*H03K 17/00* (2006.01)
*H03K 25/00* (2006.01)

(52) U.S. Cl.
USPC ............................ 377/124; 327/115; 327/117

(58) Field of Classification Search
USPC .................. 327/124, 291, 295, 299, 115, 117
See application file for complete search history.

(56) References Cited

U.S. PATENT DOCUMENTS

| 6,023,177 | A  | * | 2/2000  | Kim et al. ...................... 327/142 |
| 6,956,423 | B2 | * | 10/2005 | Neff ................................ 327/291 |
| 7,301,384 | B2 | * | 11/2007 | Hamdan et al. ................ 327/291 |
| 7,492,205 | B2 | * | 2/2009  | Hayakawa ..................... 327/295 |

\* cited by examiner

*Primary Examiner* — Hai L Nguyen

(57) ABSTRACT

A shift frequency demultiplier with automatic reset function is N-frequency demultiplication (N>2) and includes N-1 registers connected with each other and defined from a first register to an (N-1)th register. Each of the registers has an input end, an output end, a reset end and a clock end. For the registers from the first register to the (N-2)th register, the output end of every register is connected with the input end of a next register adjacent thereto, the output end of the (N-1)th register is connected with the input end of the first register by a reverser. The reset end of the (N-1)th register is connected with a system reset signal end. The system reset signal end logically multiplied by the output end of the (N-1)th register is connected with the reset ends of the registers from the first register to the (N-2)th register.

7 Claims, 6 Drawing Sheets

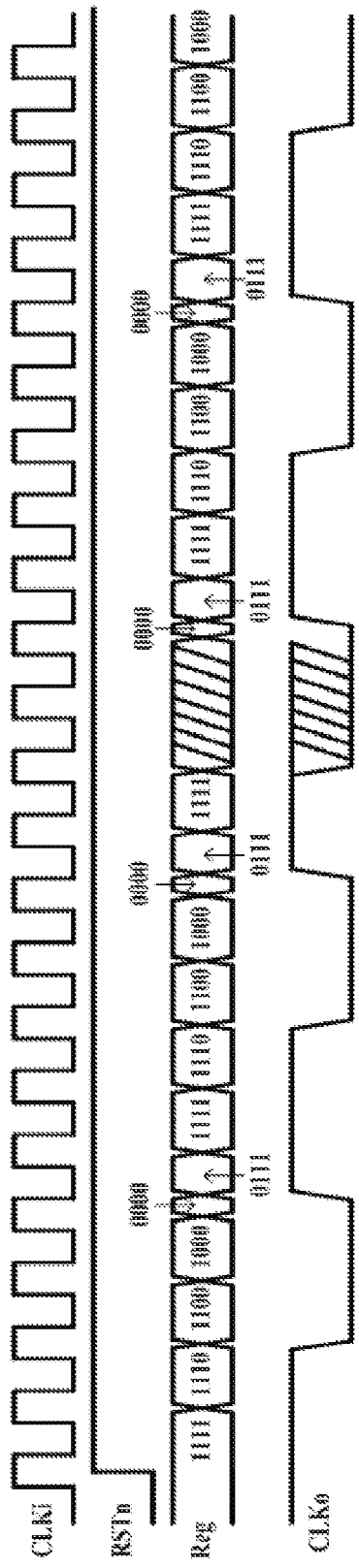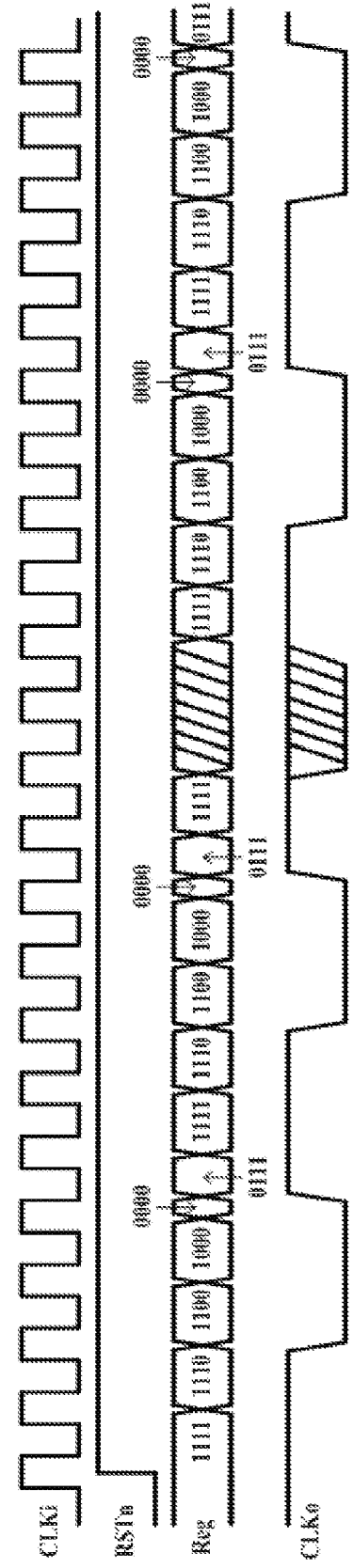
Fig. 8
Fig. 9

SHIFT FREQUENCY DEMULTIPLIER WITH AUTOMATIC RESET FUNCTION

BACKGROUND OF THE PRESENT INVENTION

1. Field of Invention

The present invention relates to a shift frequency demultiplier, and more particularly to a shift frequency demultiplier with the automatic reset function.

2. Description of Related Arts

The shift frequency demultiplier and the count frequency demultiplier are two kinds of common frequency demultipliers.

Compared with the shift frequency demultiplier, the count frequency demultiplier has more complex control logic and can not meet the timing requirements in the high frequency design, thus it is commonly used to design the frequency demultiplier with middle and low frequency clocks. The shift frequency demultiplier has much easier control logic and can meet the timing requirements in the high frequency design, thus it is commonly used to design the frequency demultiplier with high frequency clock. However, the shift frequency demultiplier has a fatal defect that the quality of the frequency-demultiplied clock entirely depends on the initial state of the register group and the state transition during the operation. Once the error of the state occurs due to some unexpected reasons, the error of the frequency demultiplication, even the entire error will be directly produced.

FIG. 1 is a circuit diagram of an existing five-frequency demultiplication shift frequency demultiplier which comprises five registers connected with each other. The reset end Sn or Rn of every register is connected with an input reset signal RSTn, the clock end CK of every register is connected with an input clock signal CLK. Every register has an input end D and an output end Q. FIG. 2 is a waveform graph of FIG. 1. When the output end Q of the fifth register outputs a high level signal, the clock signal CLKo is high level, thereby frequency-demultiplying the input clock signal CLKi. Referring to FIG. 3, if the state of the shift frequency demultiplier is changed to be "0000" due to the reason that the error occurs at the intermediate state, the shift frequency demultiplier can't be normally recovered, thus the error of the shift frequency demultiplication occurs. Referring to FIG. 4, if the state of the shift frequency demultiplier is changed to be "1111" due to the reason that the error occurs at the intermediate state, the shift frequency demultiplier can't be normally recovered, thus the error of the shift frequency demultiplication occurs. Referring to FIG. 5, if discontinuous "0" or "1" occurs due to the reason that the error occurs at the intermediate state, the shift frequency demultiplier can't be normally recovered, thus the error of the shift frequency demultiplication occurs.

SUMMARY OF THE PRESENT INVENTION

An object of the present invention is to provide a shift frequency demultiplier with the automatic reset function.

Accordingly, in order to accomplish the above object, the present invention provides a shift frequency demultiplier with the automatic reset function which is an N-frequency demultiplication shift frequency demultiplier, wherein N>2, the shift frequency demultiplier comprises:

N-1 registers connected with each other and defined from a first register to an (N-1)th register; N-2 AND gates defined from a first AND gate to an (N-2)th AND gate and a reverser, wherein each of the N-1 registers has an input end, an output end, a reset end and a clock end, wherein for the registers from the first register to the (N-2)th register, the output end of every register is connected with the input end of a next register adjacent thereto, the output end of the (N-1)th register is connected with the input end of the first register by the reverser, wherein the reset end of the (N-1)th register is connected with a system reset signal end, the system reset signal end and the output end of the (N-1)th register are respectively connected with two input ends of each of the N-2 AND gates, an output end of each of the N-2 AND gates is connected with the reset end of a corresponding register, wherein the clock end of each of the N-1 registers is connected with a clock signal end.

Compared with the prior art, the shift frequency demultiplier with the automatic reset function of the present invention has the simple structure and is easy to use. Even if the error occurs at the intermediate state, the shift frequency demultiplier can be normally recovered after a period of time, thus ensuring the correctness of the frequency demultiplication.

These and other objectives, features, and advantages of the present invention will become apparent from the following detailed description, the accompanying drawings, and the appended claims.

BRIEF DESCRIPTION OF THE DRAWINGS

FIG. 8 is a waveform graph of the shift frequency demultiplier with automatic reset function according to the preferred embodiment of the present invention which has been normally recovered after the occurrence of the first error.

FIG. 9 is a waveform graph of the shift frequency demultiplier with automatic reset function according to the preferred embodiment of the present invention which has been normally recovered after the occurrence of the second error.

DETAILED DESCRIPTION OF THE PREFERRED EMBODIMENT

A shift frequency demultiplier with automatic reset function of the present invention is an N-frequency demultiplication (N>2) shift frequency demultiplier and comprises N-1 registers connected with each other and defined from the first register to the (N-1)th register. Every register has an input end, an output end, a reset end and a clock end. For the registers from the first register to the (N-2)th register, the output end of every register is connected with the input end of the next register adjacent thereto. The output end of the (N-1)th register is connected with the input end of the first register by a reverser. The reset end of the (N-1)th register is connected with a system reset signal end. The system reset signal end logically multiplied by the output end of the (N-1)th register is connected with the reset ends of the registers from the first register to the (N-2)th register, namely, the shift frequency demultiplier comprises N-2 AND gates defined from the first AND gate to the (N-2)th AND gate. The clock end of every register is connected with the clock signal end.

The initial state of every register is set to "1" (or "0"). The state of every register is shift in turn to the next register. The state of the first register is shift to the second register, the state of the second register is shift to the third register and so on. Different from the common shift frequency demultiplier, the output end of the (N-1)th register is connected with the input end of the first register by an reverser. Simultaneously, the output signal of the (N-1)th register acts as the reset signal of the other (N-2) registers (which are reset by "0" or "1"). Therefore, after N operating states, the (N-1)th register can always reset the other (N-2) registers for completely returning to the initial state. Then the next N-state cycle is carried on. Even if the error occurs at the intermediate operating state, it can be normally recovered after a period of time, thereby ensuring the normal operation of the frequency demultiplier.

Figure 1:
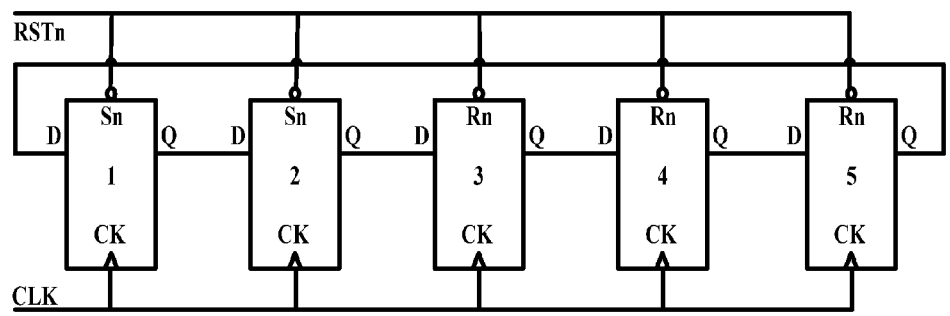
FIG. 1 is a circuit diagram of the shift frequency demultiplier of the prior art.
Figure 2:
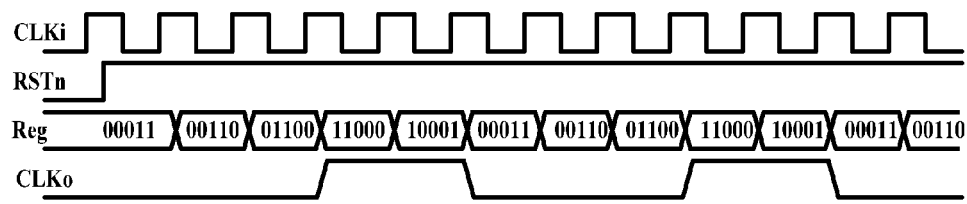
FIG. 2 is a waveform graph of the shift frequency demultiplier of the prior art.
Figure 3:
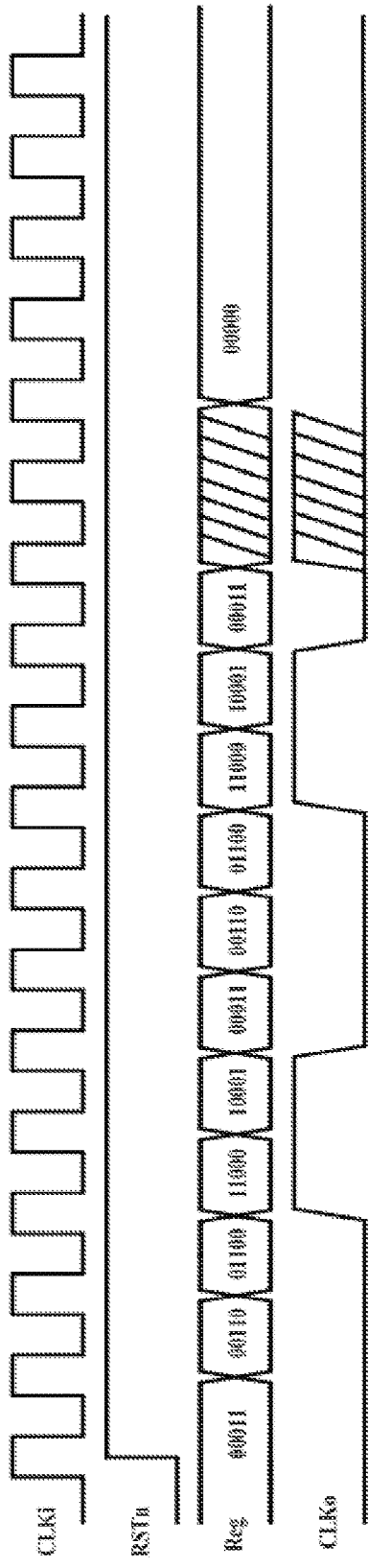
FIG. 3 is a waveform graph of the shift frequency demultiplier of the prior art when the first error occurs.
Figure 4:
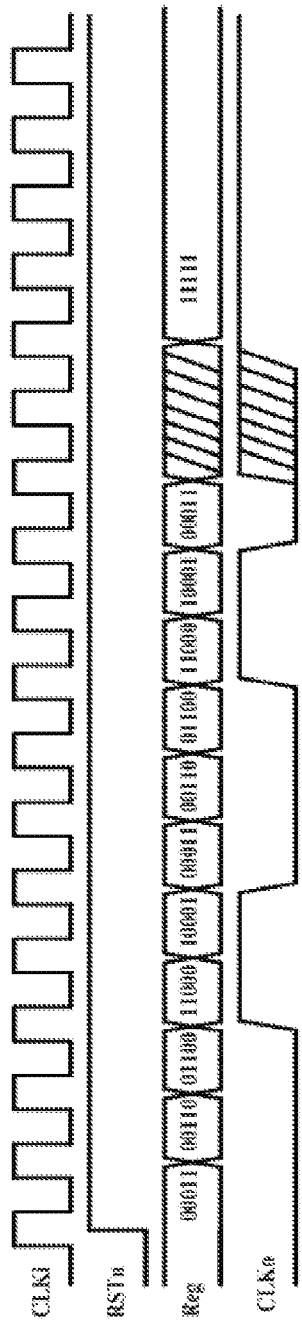
FIG. 4 is a waveform graph of the shift frequency demultiplier of the prior art when the second error occurs.
Figure 5:
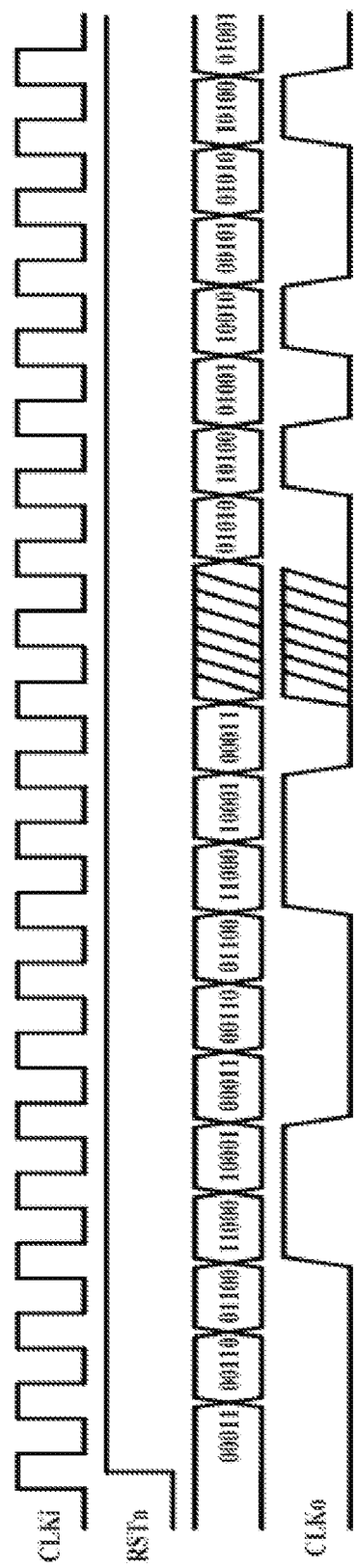
FIG. 5 is a waveform graph of the shift frequency demultiplier of the prior art when the third error occurs.
Figure 6:
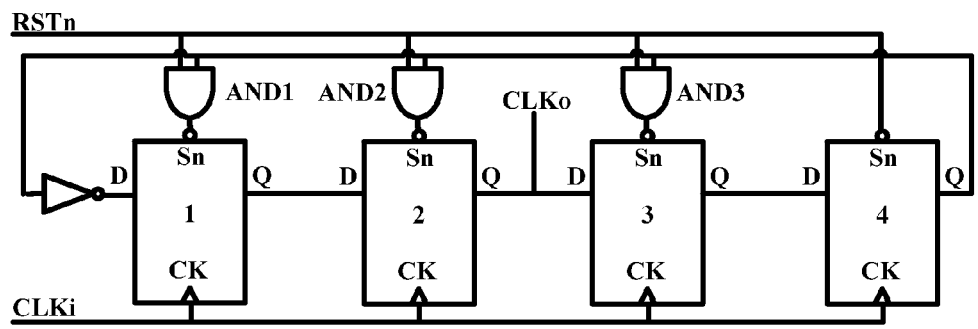
FIG. 6 is a circuit diagram of a shift frequency demultiplier with automatic reset function according to a preferred embodiment of the present invention.

Referring to FIG. 6 of the drawings, a shift frequency demultiplier with automatic reset function according to a preferred embodiment of the present invention is illustrated, wherein the shift frequency demultiplier is a five-frequency demultiplication shift frequency demultiplier and comprises a first register 1, a second register 2, a third register 3, a fourth register 4, a first AND gate AND1, a second AND gate AND2, a third AND gate AND3 and an reverser. Every register has an input end D, an output end Q, a reset end Sn and a clock end CK. The input end of the reverser is connected with the output end Q of the fourth register 4, the output end of the reverser is connected with the input end D of the first register 1. The output end Q of the first register 1 is connected with the input end D of the second register 2, the output end Q of the second register 2 is connected with the input end D of the third register 3, the output end Q of the third register 3 is connected with the input end D of the fourth register 4. One input end of the first AND gate AND1 is connected with the system reset signal end RSTn, the other input end thereof is connected with the input end of the reverser, the output end thereof is connected with the reset end Sn of the first register 1. One input end of the second AND gate AND2 is connected with the system reset signal end RSTn, the other input end thereof is connected with the input end of the reverser, the output end thereof is connected with the reset end Sn of the second register 2. One input end of the third AND gate AND3 is connected with the system reset signal end RSTn, the other input end thereof is connected with the input end of the reverser, the output end thereof is connected with the reset end Sn of the third register 3. Each of the four registers has a clock end CK connected with a clock signal end CLKi. The output end Q of the second register 2 outputs the frequency-demultiplied clock signal CLKo.

Figure 7:
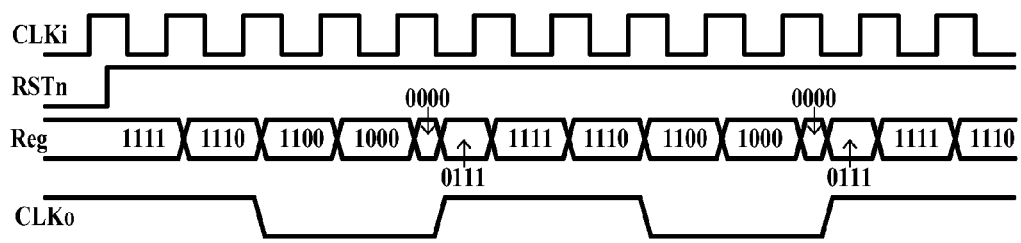
FIG. 7 is a waveform graph of the shift frequency demultiplier with automatic reset function according to the preferred embodiment of the present invention.

FIG. 7 is a waveform graph of the shift frequency demultiplier with automatic reset function according to the preferred embodiment of the present invention. CLKi is the input clock signal, RSTn is the system reset signal, Reg is the state diagram of the shift frequency demultiplier, CLKo is the output frequency-demultiplied clock signal. The initial state of the shift frequency demultiplier is "1111", and then, due to the reason that the output end Q of the fourth register 4 is connected with the input end D of the first register 1 by the reverser, the state of the first register 1 is shift to the second register 2, the state of the second register 2 is shift to the third register 3, the state of the third register 3 is shift to the fourth register 4. Therefore, the $2^{nd}$ state of the shift frequency demultiplier is changed to be "1110". By analogy, the $3^{rd}$ state of the shift frequency demultiplier is changed to be "1100", the $4^{th}$ state of the shift frequency demultiplier is changed to be "1000", the $5^{th}$ state of the shift frequency demultiplier is changed to be "0000" and here the output end Q of the fourth register outputs the low level. By the first AND gate AND1, the second AND gate AND2 and the third AND gate AND3, the first register 1, the second register 2 and the third register 3 are reset, thereby the state of the shift frequency demultiplier is changed to be "0111". By analogy, go into the cycle of the next state.

Figure 10:
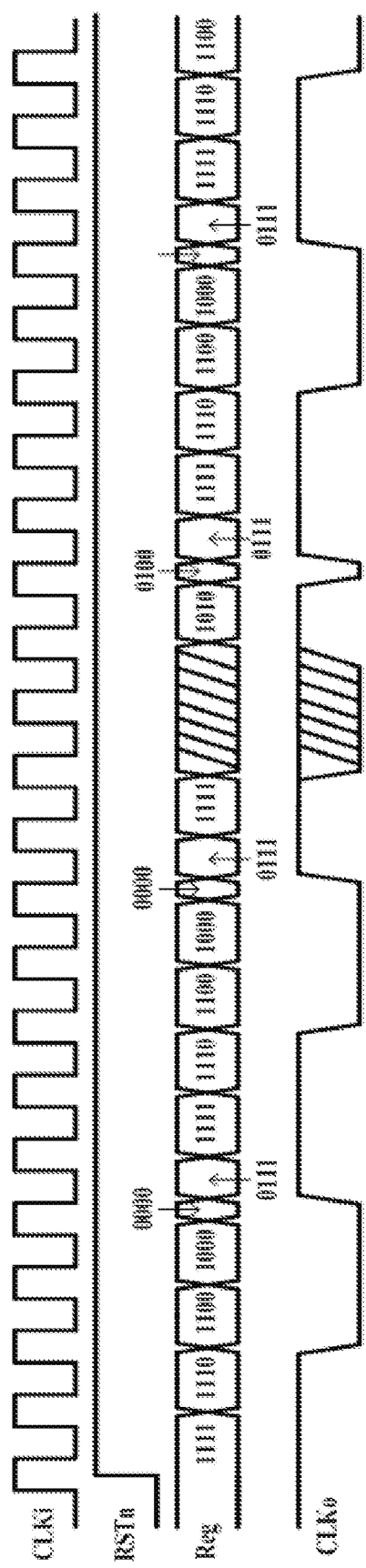
FIG. 10 is a waveform graph of the shift frequency demultiplier with automatic reset function according to the preferred embodiment of the present invention which has been normally recovered after the occurrence of the third error.

FIGS. 8 to 10 are waveform graphs of the shift frequency demultiplier with automatic reset function according to the preferred embodiment of the present invention which still can be normally recovered after the occurrence of the first, second and third errors, respectively. As shown in FIG. 8, when the state of the shift frequency demultiplier is changed to be "0000" for the reason that the error occurs at the intermediate state, the shift frequency demultiplier can be normally recovered, thus obtaining the correct frequency demultiplication. As shown in FIG. 9, when the state of the shift frequency demultiplier is changed to be "1111" for the reason that the error occurs at the intermediate state, the shift frequency demultiplier can be normally recovered, thus obtaining the correct frequency demultiplication. As shown in FIG. 10, when discontinuous "0" or "1" occurs at the state of the shift frequency demultiplier for the reason that the error occurs at the intermediate state, the shift frequency demultiplier can be normally recovered, thus obtaining the correct frequency demultiplication.

It can be seen that even if the error occurs at the intermediate state, namely, the state is changed to be "0000" or "1111" or discontinuous "1010", the shift frequency demultiplier still can be normally recovered after a period of time.

The shift frequency demultiplier with the automatic reset function of the present invention has the simple structure and is easy to use. Even if the error occurs at the intermediate state, the shift frequency demultiplier still can be normally recovered after a period of time, thus ensuring the correctness of the frequency demultiplication.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A shift frequency demultiplier with automatic reset function which is N-frequency demultiplication, wherein N>2, comprising:
N-1 registers connected with each other and defined from a first register to an (N-1)th register; N-2 AND gates defined from a first AND gate to an (N-2)th AND gate and a reverser,
wherein each of said N-1 registers has an input end, an output end, a reset end and a clock end, wherein for said registers from said first register to said (N-2)th register, said output end of every register is connected with said input end of a next register adjacent thereto, said output end of said (N-1)th register is connected with said input end of said first register by said reverser, wherein said reset end of said (N-1)th register is connected with a system reset signal end, said system reset signal end and said output end of said (N-1)th register are respectively connected with two input ends of each of said N-2 AND gates, an output end of each of said N-2 AND gates is connected with said reset end of a corresponding register, wherein said clock end of each of said N-1 registers is connected with a clock signal end.

2. The shift frequency demultiplier, as recited in claim 1, wherein N is equal to 5, said shift frequency demultiplier comprises said first register, a second register connected with said first register, a third register connected with said second register, a fourth register connected with said third register and said reverser, wherein an input end of said reverser is connected with an output end of said fourth register, an output end of said reverser is connected with said input end of said first register.

3. The shift frequency demultiplier, as recited in claim 2, wherein said output end of said first register is connected with said input end of said second register, said output end of said second register is connected with said input end of said third register, said output end of said third register is connected with said input end of said fourth register.

4. The shift frequency demultiplier, as recited in claim 2, wherein said reset end of said first register is connected with an output end of said first AND gate, a first input end of said first AND gate is connected with said reset signal end and said reset end of said fourth register, a second input end of said first AND gate is connected with said output end of said fourth register.

5. The shift frequency demultiplier, as recited in claim 2, wherein said reset end of said second register is connected with an output end of said second AND gate, a second input end of said second AND gate is connected with said reset signal end and said reset end of said fourth register, a second input end of said second AND gate is connected with said output end of said fourth register.

6. The shift frequency demultiplier, as recited in claim 2, wherein said reset end of said third register is connected with an output end of said third AND gate, a third input end of said third AND gate is connected with said reset signal end and said reset end of said fourth register, a second input end of said third AND gate is connected with said output end of said fourth register.

7. The shift frequency demultiplier, as recited in claim 2, wherein said output end of said second register outputs a frequency-demultiplied clock signal.

* * * * *